United States Patent
Bessho et al.

(10) Patent No.: US 11,354,066 B2
(45) Date of Patent: Jun. 7, 2022

(54) COMMAND FILTER FILTERING COMMAND HAVING PREDETERMINED PULSE WIDTH

(71) Applicant: MICRON TECHNOLOGY, INC., Boise, ID (US)

(72) Inventors: Shinji Bessho, Hachioji (JP); Takuya Nakanishi, Hino (JP)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 16/915,889

(22) Filed: Jun. 29, 2020

(65) Prior Publication Data
US 2021/0405923 A1   Dec. 30, 2021

(51) Int. Cl.
*G06F 3/06* (2006.01)
*G11C 11/4076* (2006.01)

(52) U.S. Cl.
CPC .......... *G06F 3/0659* (2013.01); *G06F 3/0604* (2013.01); *G06F 3/0673* (2013.01); *G11C 11/4076* (2013.01)

(58) Field of Classification Search
None
See application file for complete search history.

(56) References Cited

U.S. PATENT DOCUMENTS

| 6,992,610 | B2* | 1/2006 | Komarura | H03F 3/2173 341/152 |
| 7,847,491 | B2* | 12/2010 | Lin | H02M 1/36 315/307 |
| 8,339,174 | B2* | 12/2012 | Yang | H03K 7/08 327/239 |
| 9,363,033 | B2* | 6/2016 | Dutta | H04J 14/08 |
| 10,790,784 | B2* | 9/2020 | Jurkov | H03F 3/193 |
| 2009/0015306 | A1* | 1/2009 | Yoshizawa | H03K 5/15093 327/231 |
| 2009/0273993 | A1* | 11/2009 | Byun | G11C 7/22 365/193 |

* cited by examiner

*Primary Examiner* — Elias Mamo
(74) *Attorney, Agent, or Firm* — Dorsey & Whitney LLP

(57) ABSTRACT

Disclosed herein is an apparatus that includes a command shifter configured to receive a command pulse and generate a plurality of first command shifted pulses in parallel, wherein each of the plurality of first command shifted pulses has the same width as the command pulse and the plurality of first command shifted pulses have different phases from each other, and a command filter configured to determine if a plurality of second command shifted pulses are generated correspondingly to the plurality of first command shifted pulses or not generated responsive to pulse overlapping among at least ones of the plurality of first command shifted pulses.

20 Claims, 8 Drawing Sheets

COMMAND FILTER FILTERING COMMAND HAVING PREDETERMINED PULSE WIDTH

BACKGROUND

In a semiconductor device such as a dynamic random access memory (DRAM), external read commands are successively issued in shortest cycles in some cases. In these cases, when an internal read command is changed from an inactive level to an active level each time the external read command is issued, current consumption increases. Accordingly, in some semiconductor devices, the pulse width of the internal read command is extended to a same length as the shortest cycle of the external read commands to reduce current consumption in a case in which the external read commands are successively issued in the shortest cycles.

Meanwhile, the pulse width of an internal command does not need to be extended as for external commands that are not successively issued, such as a mode register read command. However, if a command shifter that counts latencies of the internal command is provided for each of internal commands having different pulse widths, there is a problem that the circuit scale or the current consumption is increased. Therefore, a semiconductor device that can assign internal commands having different pulse widths to a common command shifter is demanded.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
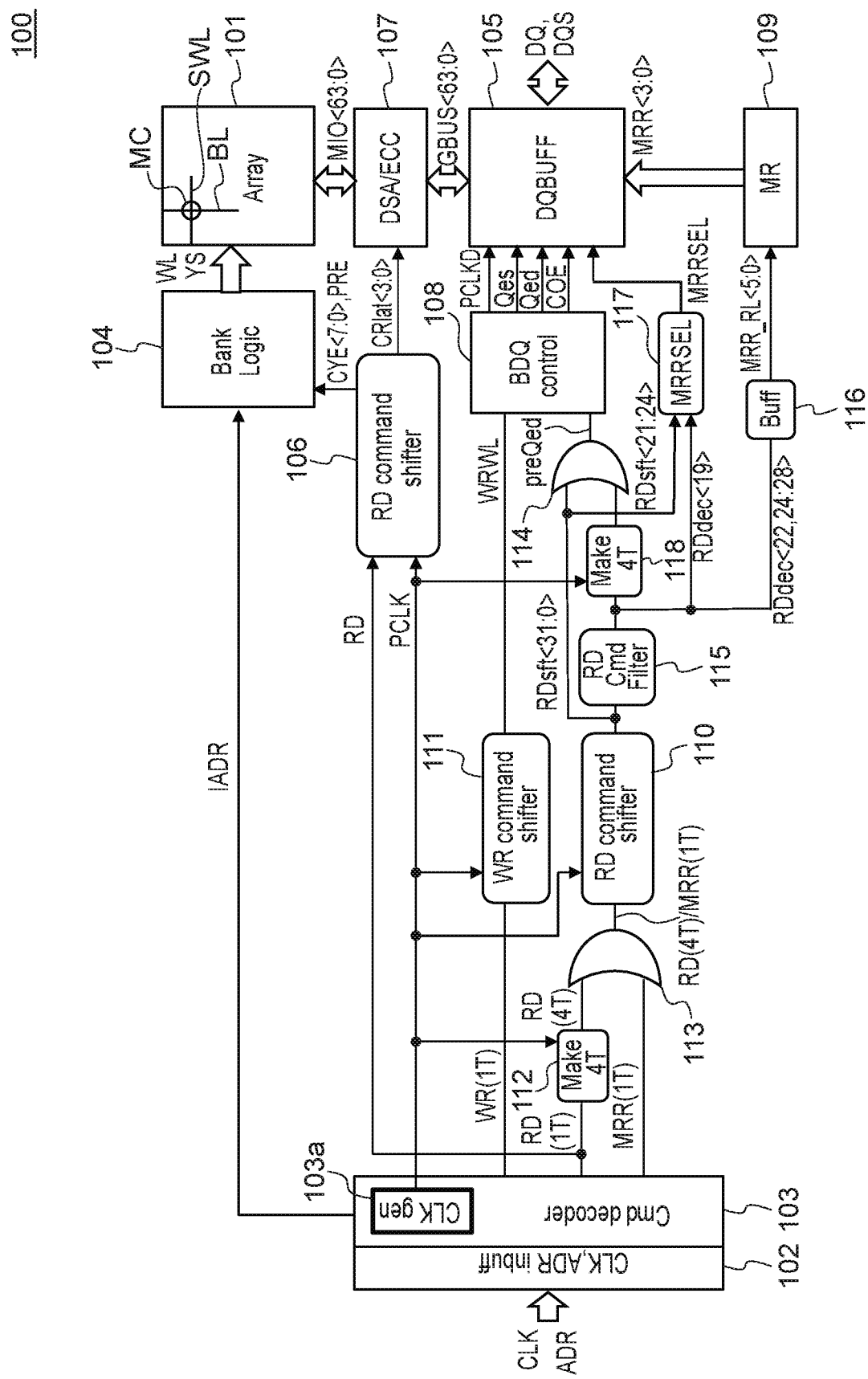
FIG. 1 is a block diagram showing a configuration of a semiconductor device according to an embodiment of the present disclosure.

FIG. 1 is a block diagram of a semiconductor device 100 according to one embodiment of the present disclosure. The semiconductor device 100 shown in FIG. 1 is a DRAM and includes a memory cell array 101, a clock address input buffer 102, a command decoder 103, a bank logic circuit 104, and an I/O buffer circuit 105. The memory cell array 101 includes a plurality of word lines SWL, a plurality of bit lines BL, and a plurality of memory cells MC respectively placed at intersections between the word lines SWL and the bit lines BL. The word lines SWL are selected according to a word line selection signal WL output from the bank logic circuit 104. The bit lines BL are selected according to a column switch selection signal YS output from the bank logic circuit 104.

A clock signal CLK and an address signal ADR are supplied from outside to the clock address input buffer 102. The clock signal CLK and the address signal ADR input to the clock address input buffer 102 are supplied to the command decoder 103. The command decoder 103 decodes the address signal ADR to generate a plurality of internal commands including an internal read command RD, an internal write command WR, and an internal mode register read command MRR, and supplies an internal address signal IADR to the bank logic circuit 104. The command decoder 103 includes a clock generator 103a. The clock generator 103a generates an internal clock signal PCLK. The internal clock signal PCLK and the internal read command RD are supplied to a read command shifter 106. The read command shifter 106 provides a predetermined latency to the read command RD in synchronization with the internal clock signal PCLK to define a timing of a column selection operation of the bank logic circuit 104. Column selection signals CYE<7:0> and a precharge signal PRE are supplied from the read command shifter 106 to the bank logic circuit 104.

In a read operation, a read data that is read from the memory cell array 101 is transferred to a main I/O line MIO<63:0>. The read data transferred to the main I/O line MIO<63:0> is transferred to the I/O buffer circuit 105 via a data sense amplifier DSA/error correction circuit ECC 107 and a global bus GBUS<63:0>, and is output to outside in synchronization with various timing signals generated by a control circuit 108. In a write operation, a write data that is input from outside to the I/O buffer circuit 105 is written to the memory cell array 101 via the global bus GBUS<63:0>, the DSA/ECC 107, and the main I/O line MIO<63:0>. In a mode register read operation, a mode signal MRR<30> read from a mode register 109 is transferred to the I/O buffer circuit 105 and is output to outside in synchronization with various timing signals generated by the control circuit 108.

Figure 2A:
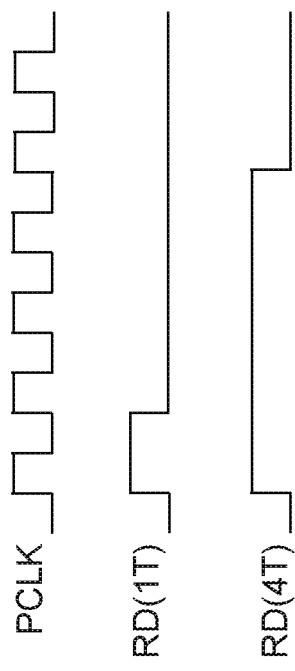
FIGS. 2A and 2B are timing charts for explaining an operation of a command extender according to an embodiment of the present disclosure.
Figure 2B:
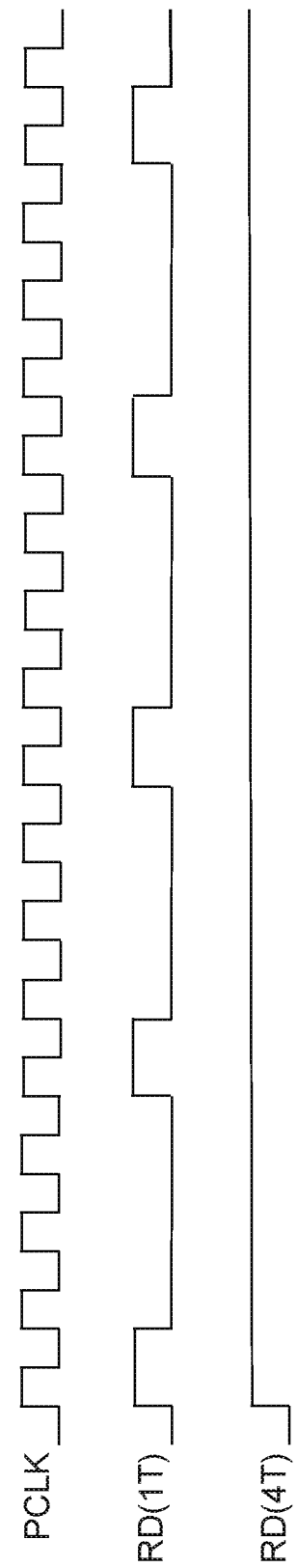

The pulse widths (the periods in which the active level is maintained) of the internal read command RD, the internal write command WR, and the internal mode register read command MRR generated by the command decoder 103 are all one clock cycle (=1T) of the internal clock signal PCLK. Among these commands, the internal read command RD and the internal mode register read command MRR are supplied to a read command shifter 110 and the internal write command WR is supplied to a write command shifter 111. That is, the read command shifter 110 is assigned in common to the internal read command RD and the internal mode register read command MRR. The internal read command RD is supplied to the read command shifter 110 in a state in which the pulse width has been extended. In some embodiments of the disclosure the pulse width of the internal read command RD is extended to more than one clock cycle of the internal clock signal PCLK. In some embodiments of the disclosure the pulse width is extended to more than two clock cycles of the internal clock signal PCLK. For example, in some embodiments of the disclosure, the pulse width is extended from 1T to 4T by a command extender 112, without being supplied directly to the read command shifter 110. An operation of the command extender 112 according to an embodiment of the present disclosure is as shown in FIGS. 2A and 2B. The command extender 112 converts the internal read command RD(1T) where the pulse width (the period in which the active level is maintained) is 1T to an internal read command RD(4T) where the pulse width is 4T in synchronization with the internal clock signal PCLK. That is, the extended pulse width of the internal read command RD is four clock cycles (=4T) of the internal clock signal PCLK. The shortest cycle of the internal read command RD(1T) is four clock cycles (=4T). Accordingly, when the internal read command RD(1T) is successively activated in the shortest cycles as shown in FIG. 2B, the internal read command RD(4T) maintains the active level (a high level) without changing to an inactive level (a low level).

Figure 3:
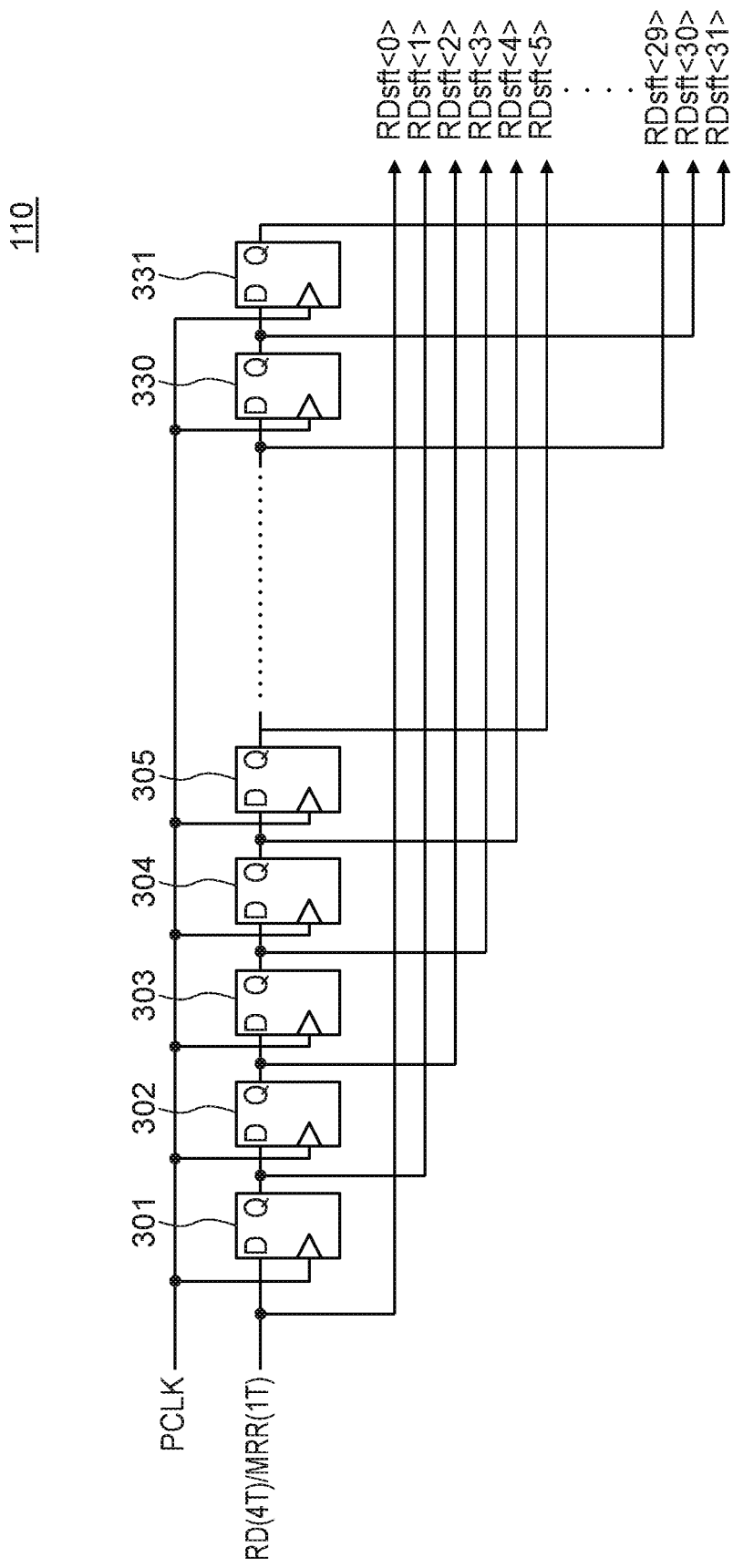
FIG. 3 is a circuit diagram of a read command shifter according to an embodiment of the present disclosure.

The internal read command RD(4T) where the pulse width has been extended to 4T and the internal mode register read command MRR(1T) where the pulse width is 1T are supplied to the read command shifter 110 via an OR gate circuit 113. The read command shifter 110 and the write command shifter 111 shift the phase of the input internal command in response to the internal clock signal PCLK. FIG. 3 is a circuit diagram of the read command shifter 110 according to an embodiment of the present disclosure. As shown in FIG. 3, the read command shifter 110 is a shift register including 31 latch circuits 301 to 331 that are cascade connected. The latch circuits 301 to 331 each perform a latch operation in synchronization with the internal clock signal PCLK. Accordingly, the internal read command RD(4T) and the internal mode register read command MRR(1T) input to the read command shifter 110 are shifted in synchronization with the internal clock signal PCLK. Read shift signals RDsft<31:0> are output from the latch circuits 301 to 331, respectively. Among the read shift signals RDsft<31:0>, the read shift signal RDsft<22> is supplied to the control circuit 108 via an OR gate circuit 114. A write timing signal WRWL generated by the write command shifter 111 is supplied to the control circuit 108.

Figure 4:
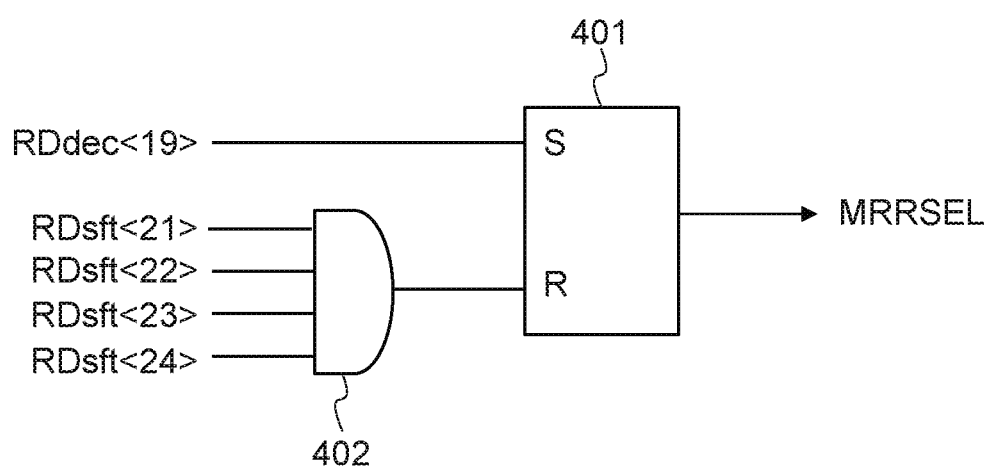
FIG. 4 is a circuit diagram of a selection circuit according to an embodiment of the present disclosure.

The read shift signals RDsft<31:0> are supplied to a command filter 115. The command filter 115 removes ones of the read shift signals RDsft<31:0> based on the internal read command RD(4T) where the pulse width has been extended to 4T and passes only ones of the read shift signals RDsft<31:0> based on the internal mode register read command MRR where the pulse width is 1T, thereby generating read decode signals RDdec<28:19>. Among the read decode signals RDdec<28:19>, read decode signals RDdec<22,24:28> are converted to mode register read signals MRR_RL<5:0> by a buffer circuit 116 and are supplied to the mode register 109. When the mode register read signals MRR_RL<5:0> are sequentially activated, the mode register 109 outputs mode signals MRR<3:0> to the I/O buffer circuit 105 in response thereto. The read decode signal RDdec<19> is supplied to a selection circuit 117. As shown in FIG. 4, the selection circuit 117 includes an SR latch circuit 401 that is set according to the read decode signal RDdec<19> and activates a selection signal MRRSEL in response to the read decode signal RDdec<19>. When the selection signal MRRSEL is activated, the I/O buffer circuit 105 outputs the mode signals MRR<3:0> to outside. On the other hand, when the selection signal MRRSEL is in an inactive state, the V/O buffer circuit 105 outputs a read data that is read from the memory cell array 101 to outside. The selection circuit 117 further includes an AND gate circuit 402 that receives the read shift signals RDsft<21:24>, and resets the SR latch circuit 401 to deactivate the selection signal MRRSEL in response to a state in which the read shift signals RDsft<21:24> are all activated. The pulse width of the read decode signal RDdec<22> is extended from 1T to 4T by a command extender 118. That is, the extended pulse width of the read decode signal RDdec<22> is four clock cycles (=4T) of the internal clock signal PCLK. The read decode signal RDdec<22> where the pulse width has been extended to 4T and the read shift signal RDsft<22> are supplied to the OR gate circuit 114. The OR gate circuit 114 generates a read timing signal preQed and supplies the generated read timing signal preQed to the control circuit 108. The read shift signal RDsft or the read decode signal RDdec input to the OR gate circuit 114 does not need to be the read shift signal RDsft<22> or the read decode signal RDdec<22> and a read shift signal or a read decode signal different according to read latencies may be input.

When the read timing signal preQed is activated, the control circuit 108 activates a read selection signal COE and read timing signals Qes and Qed. The read selection signal COE is activated when the I/O buffer circuit 105 is caused to perform a read operation. The I/O buffer circuit 105 activates the read timing signals Qes and Qed in synchronization with an internal clock signal PCLKD in a period in which the read selection signal COE is active. The read timing signal Qes is a signal permitting output of a strobe signal DQS and the read timing signal Qed is a signal permitting output of a read data DQ.

Figure 5:
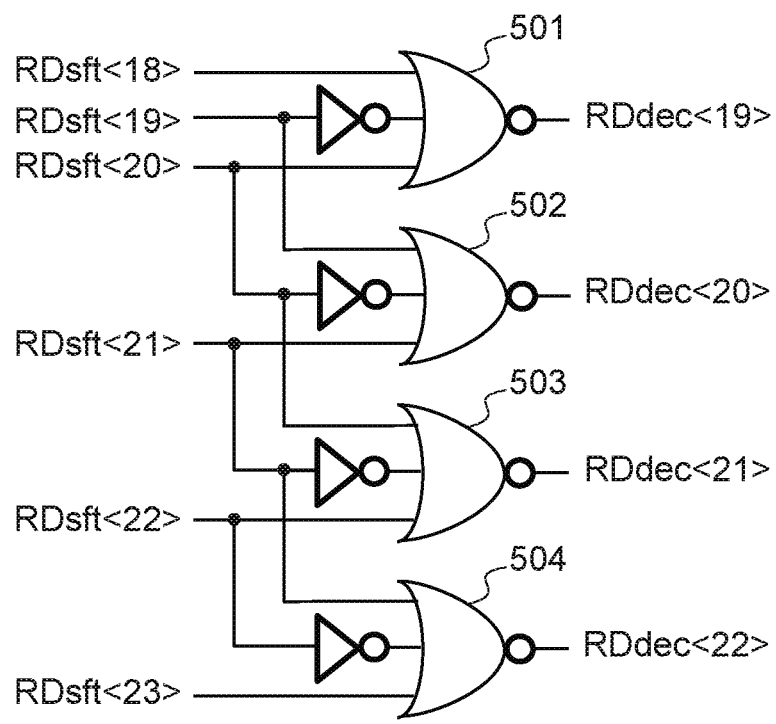
FIG. 5 is a circuit diagram of a command filter according to an embodiment of the present disclosure.
Figure 5:
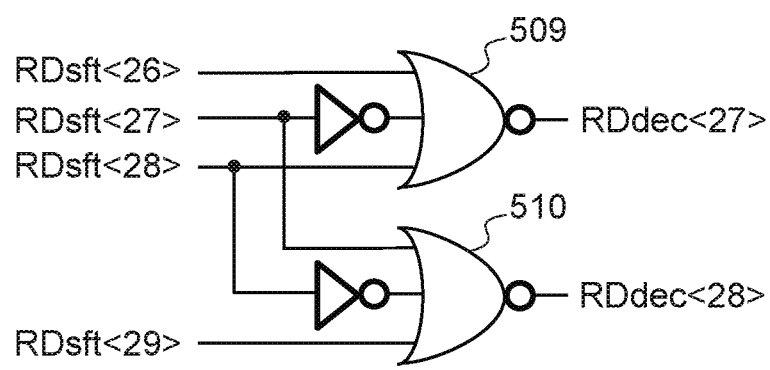

FIG. 5 is a circuit diagram of the command filter 115 according to an embodiment of the present disclosure. As shown in FIG. 5, the command filter 115 includes 10 NOR gate circuits 501 to 510. The NOR gate circuit 5xx receives an inversion signal of a corresponding read shift signal RDsft<x>, a read shift signal RDsft<x−1> preceding the read shift signal RDsft<x>, and a read shift signal RDsft<x+1> succeeding the read shift signal RDsft<x> and generates a read decode signal RDdec<x> on the basis thereof. For example, the NOR gate circuit 501 activates the read decode signal RDdec<19> to a high level when the corresponding read shift signal RDsft<19> is at a high level and the read signal signals RDsft<18> and RDsft<20> are at a low level.

Figure 6A:
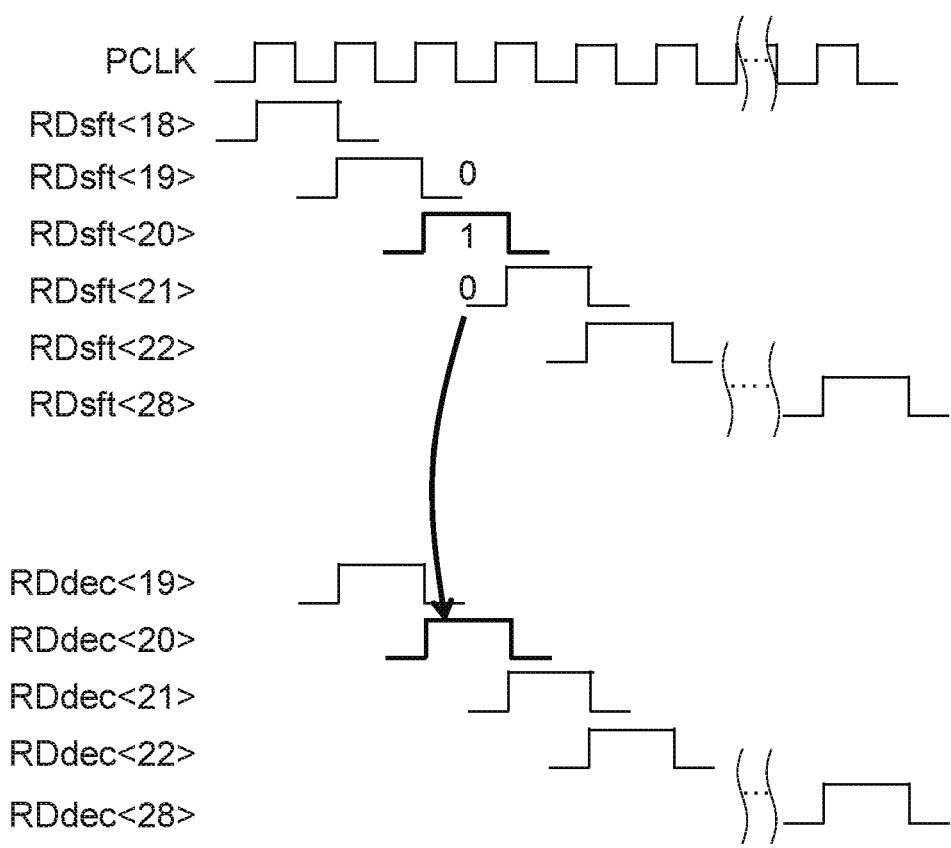
FIGS. 6A and 6B are waveform diagrams for explaining an operation of the command filter according to an embodiment of the present disclosure.

FIG. 6A is a waveform diagram for explaining an operation performed according to an embodiment of the present disclosure when the read shift signals RDsft<31:0> where the pulse width is 1T are input to the command filter 115. The read shift signals RDsft<31:0> where the pulse width is 1T appear when the internal mode register read command MRR is activated. In the case in which the pulse widths of the read shift signals RDsft<31:0> are 1T, when a certain read shift signal RDsft<x> is activated to a high level, read shift signals RDsft<x−1> and RDsft<x+1> preceding and succeeding the read shift signal RDsft<x> are always in a state deactivated to a low level as shown in FIG. 6A. That is, the read shift signals RDsft<31:0> do not overlap with each other. Shift signals are considered to "overlap" when one or more of the shift signals are concurrently at a high level. While a falling edge of a former pulse (i.e., RDsft<0>) and a rising edge of a following pulse (i.e., RDsft<1>) may be coincident to each other (e.g., as shown in FIG. 6A), in this situation the read shift signals including the former and following pulses are not considered to "overlap." Accordingly, the waveforms of the read decode signals RDdec<28:19> coincide with those of the read shift signals RDsft<28:19>. That is, the read shift signals RDsft<31:0> where the pulse width is 1T pass through the command filter 115 as they are without being filtered by the command filter 115.

Figure 6B:
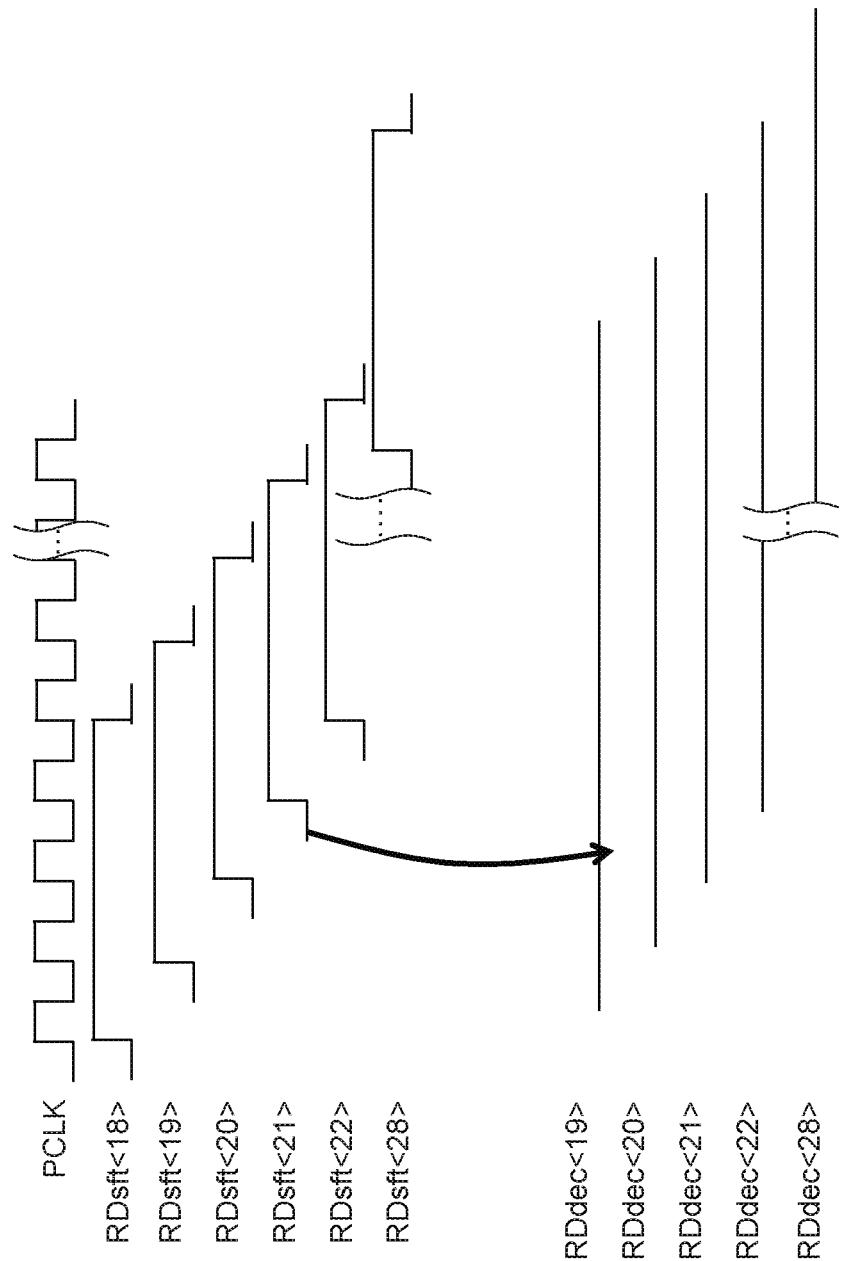

FIG. 6B is a waveform diagram for explaining an operation performed according to an embodiment of the present disclosure when the read shift signals RDsft<31:0> where the pulse width is 4T are input to the command filter 115. The read shift signals RDsft<31:0> where the pulse width is 4T appear when the internal read command RD is activated. In the case in which the pulse widths of the read shift signals RDsft<31:0> are 4T, when a certain read shift signal RDsft<x> is activated to a high level, either read shift signal RDsft<x−1> or RDsft<x+1> preceding or succeeding the read shift signal RDsft<x> is always in a state activated to a high level as shown in FIG. 6B. That is, in a period in which the read shift signal RDsft<x> is active, the next read shift signal RDsft<x+1> changes to a high level and therefore some of the read shift signals RDsft<31:0> overlap with each other. Accordingly, the read decode signals RDdec<28:19> are all fixed to a low level. That is, the read shift signals RDsft<31:0> where the pulse width is 4T are filtered by the command filter 115.

As a result, circuits provided at subsequent stages of the command filter 115 perform the mode register read operation when the internal mode register read command MRR is activated, and do not perform the mode register read operation when the internal read command RD is activated. In this way, the internal read command RD and the internal mode register read command MRR synthesized by the OR gate circuit 113 are separated by the command filter 115.

The pulse width of the read decode signal RDdec<22> is extended from 1T to 4T by the command extender 118 and the extended read decode signal RDdec<22> is input to the control circuit 108. Accordingly, the control circuit 108 activates the read selection signal COE and the read timing signals Qes and Qed in both a case in which the internal read command RD is activated and a case in which the internal mode register read command MRR is activated. Accordingly, the I/O buffer circuit 105 outputs a read data DQ that is read from the memory cell array 101 to outside when the internal read command RD is activated, and outputs the mode signals MRR<30> read from the mode register 109 to outside when the internal mode register read command MRR is activated.

Figure 7:
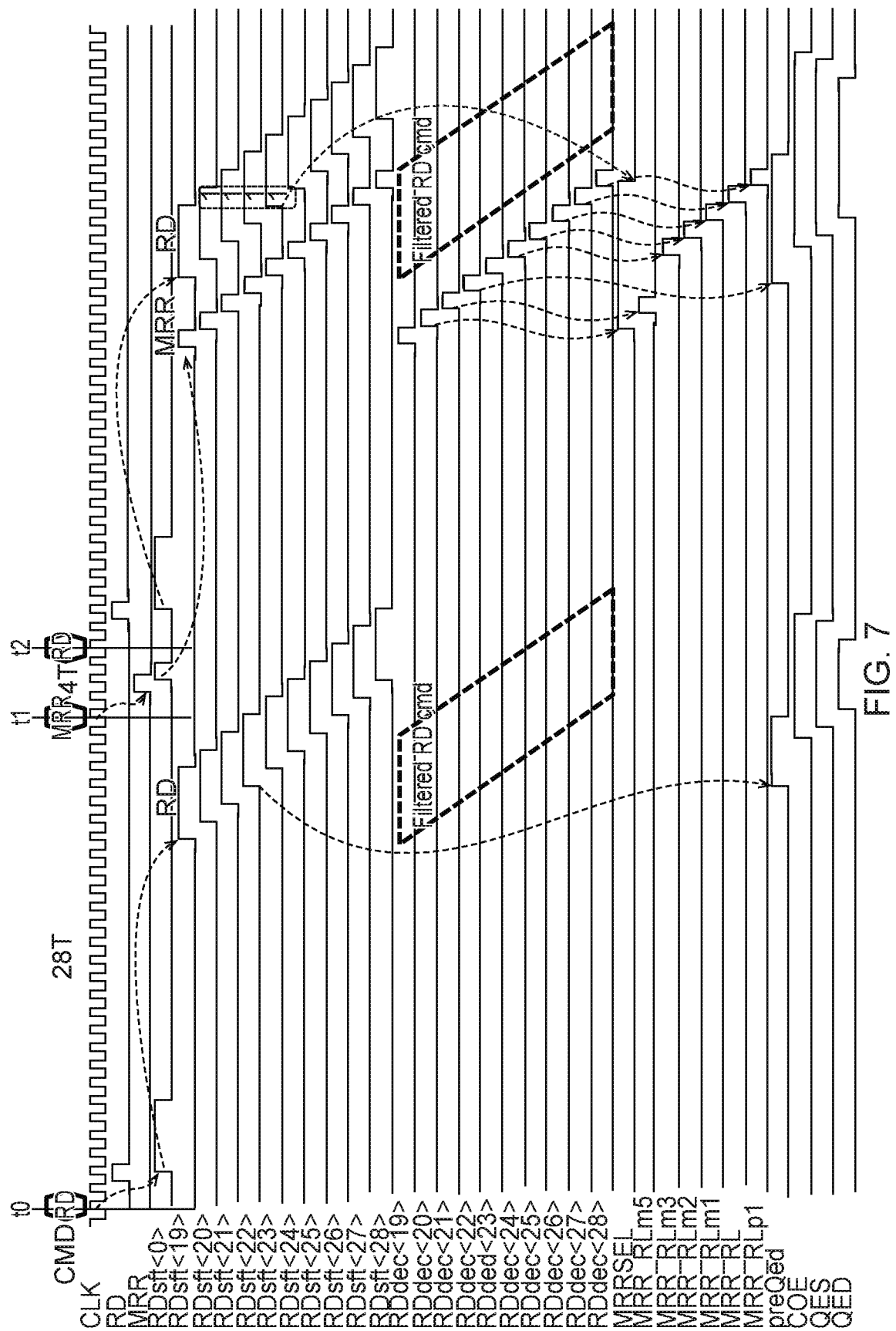
FIG. 7 is a timing chart for explaining an operation of the semiconductor device according to an embodiment of the present disclosure.

FIG. 7 is a timing chart for explaining an operation of the semiconductor device 100 according to one embodiment. In an example shown in FIG. 7, a read command is issued at a time t0, a mode register read command is issued at a time t1, which is 28 clock cycles (28T) after the time t0, and a read command is issued at a time t2, which is 4 clock cycles (4T) after the time t1. The shortest period from when a read command is issued until when a mode register read command is issued is 28 clock cycles (28T) and the shortest period from when a mode register read command is issued until when a read command is issued is four clock cycles (4T).

When a read command is issued from outside at the time t0, the command decoder 103 generates the internal read command RD in response thereto. The pulse width of the internal read command RD is extended to four clock cycles (4T) by the command extender 112. The internal read command RD having the pulse width extended to four clock cycles (4T) is input to the read command shifter 110, whereby read shift signals RDsft<31:0> having phases different from each other are generated. Because the pulse widths of the read shift signals RDsft<31:0> responsive to the internal read command RD are all 4T, the read shift signals RDsft<31:0> are filtered by the command filter 115 and the read decode signals RDdec<28:19> are maintained to a low level. Accordingly, the selection signal MRRSEL is brought to a low level. The read shift signal RDsft<22> is converted to the read timing signal preQed by the OR gate circuit 114 and is input to the control circuit 108. The control circuit 108 activates the read selection signal COE and the read timing signals Qes and Qed in response to the read timing signal preQed. This enables the read data DQ read from the memory cell array 101 to be burst output to outside.

Thereafter, when a mode register read command is issued from outside at the time t1, the command decoder 103 generates the internal mode register read command MRR in response thereto. The pulse width of the internal mode register read command MRR is 1T. The internal mode register read command MRR is input to the read command shifter 110, whereby read shift signals RDsft<31:0> having phases different from each other are generated. Because the pulse widths of the read shift signals RDsft<31:0> responsive to the internal mode register read command MRR are all 1T, the read shift signals RDsft<31:0> are not filtered by the command filter 115 and the read decode signals RDdec<28:19> are generated. Accordingly, the selection signal MRRSEL is activated to a high level in response to the read decode signal RDdec<19>. Further, the mode register read signals MRR_RL<5:0> are generated in response to the read decode signals RDdec<22,24:28>, and the mode signals MRR<3:0> are output to the I/O buffer circuit 105 in response thereto. After the pulse width of the read decode signal RDdec<22> is extended to 4T by the command filter 118, the read decode signal RDdec<22> is input to the control circuit 108 via the OR gate circuit 114. Accordingly, the mode signals MRR<3:0> read from the mode register 109 are burst output to outside.

Thereafter, when a read command is issued from outside at the time t2, the command decoder 103 generates the internal read command RD in response thereto. An operation performed in response thereto is same as that performed when a read command is issued at the time. Because the selection circuit 117 is reset at a timing when all the read shift signals RDsft<21:24> are brought to a high level, the selection signal MRRSEL changes to a low level. Accordingly, the I/O buffer circuit 105 burst-outputs the read data DQ following the mode signals MRR<3:0>.

In this way, the semiconductor device 100 according to one embodiment of the present invention counts latencies of the internal read command RD(4T) where the pulse width is 4T and latencies of the internal mode register read command MRR(1T) where the pulse width is 1T using the same read command shifter 110. Therefore, the circuit scale can be reduced. Further, the read shift signals RDsft<31:0> generated by the read command shifter 110 are input to the command filter 115. Therefore, the read decode signals RDdec<28:19> can be generated on the basis of the read shift signals RDsft<31:0> based on the internal mode register read command MRR(1T) while the read shift signals RDsft<31:0> based on the internal read command RD(4T) are filtered.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a command shifter configured to receive a command pulse and generate a plurality of first command shifted pulses in parallel, wherein each of the plurality of first command shifted pulses has the same width as the command pulse and the plurality of first command shifted pulses have different phases from each other; and
   a command filter configured to determine if a plurality of second command shifted pulses are generated correspondingly to the plurality of first command shifted pulses or not generated responsive to pulse overlapping among at least ones of the plurality of first command shifted pulses.

2. The apparatus of claim 1, wherein the command pulse is brought into a first pulse width in response to a first external command signal and brought into a second pulse width different from the first pulse width in response to a second external command signal.

3. The apparatus of claim 2, wherein the second pulse width is greater than the first pulse width.

4. The apparatus of claim 3,
   wherein the command shifter is configured to generate the plurality of first command shifted pulses in synchronization with a clock signal,
   wherein the first pulse width is one cycle of the clock signal, and
   wherein the second pulse width is more than one cycle of the clock signal.

5. The apparatus of claim 4, wherein the second pulse width is more than two cycles of the clock signal.

6. The apparatus of claim 5, further comprising:
   a command decoder configured to generate a first internal command signal having the first pulse width in response to the first external command signal and a second internal command signal having the first pulse width in response to the second external command signal; and
   a command extender configured to generate the command pulse having the second pulse width based on the second internal command signal.

7. The apparatus of claim 6, wherein the command filter is configured to activate each of the second command shifted pulses when an associated one of the first command shifted pulses is activated while a preceding one of the first command shifted pulses and a succeeding one of the first command shifted pulses are deactivated.

8. The apparatus of claim 2, further comprising:
   a memory cell array storing an user data;
   a mode register storing a mode signal; and
   an I/O buffer circuit,
   wherein the user data is output to outside via the I/O buffer circuit in response to the first command shifted pulses having the second pulse width, and
   wherein the mode signal is output to outside via the I/O buffer circuit in response to the second command shifted pulses.

9. The apparatus of claim 8, further comprising a control circuit configured to activate the I/O buffer circuit based on the first command shifted pulses having the second pulse width.

10. The apparatus of claim 9, further comprising another command extender configured to be supplied with the second command shifted pulses to generate third command shifted pulses having the second pulse width,
    wherein the control circuit is further configured to activate the I/O buffer circuit based on the third command shifted pulses.

11. The apparatus of claim 10, further comprising a selection circuit configured to generate a selection signal that enables the I/O buffer circuit to output the mode signal,
    wherein the selection circuit is configured to activate the selection signal in response to a predetermined one of the second command shifted pulses.

12. The apparatus of claim 11, wherein the selection circuit is configured to deactivate the selection signal when predetermined two or more of the first command shifted pulses are in an activate state at a same time.

13. An apparatus comprising:
    a command decoder configured to be supplied with an external command signal and generate first and second command signals having a first pulse width;
    a first command extender configured to generate a third command signal having a second pulse width greater than the first pulse width by extending a pulse width of the second command signal having the first pulse width to the second pulse width;
    a command shifter supplied with the first and third command signals and configured to generate a plurality of first shift signals having different phases from one another by shifting the first and third command signals in synchronization with a clock signal; and
    a second command extender configured to generate a plurality of second shift signals by extending a pulse width of the first shift signals having the first pulse width to the second pulse width.

14. The apparatus of claim 13, further comprising a command filter connected between the command shifter and the second command extender and configured to filter the first shift signals having the second pulse width.

15. The apparatus of claim 14, wherein the command filter is configured to activate each of the second shift signals when an associated one of the first shift signals is activated while a preceding one of the first shift signals and a succeeding one of the first shift signals are deactivated.

16. The apparatus of claim 13, further comprising:
    a mode register configured to store a mode signal; and
    an I/O buffer circuit,
    wherein the mode signal is output to outside via the I/O buffer circuit in response to the second shift signals.

17. The apparatus of claim 16, further comprising a memory cell array storing user data,
    wherein the user data is output to outside via the I/O buffer circuit in response to the first shift signals having the second pulse width.

18. An apparatus comprising:
    a command shifter configured to generate a plurality of first shift signals having different phases from one another by shifting a command signal in synchronization with a clock signal; and
    a command filter configured to be supplied with the first shift signals and generate a plurality of second shift signals having different phases from one another,
    wherein command filter is configured to activate each of the second shift signals when an associated one of the first shift signals is activated while a preceding one of the first shift signals and a succeeding one of the first shift signals is deactivated.

19. The apparatus of claim 18, wherein the command signal includes a first command signal having one cycle of the clock signal and a second command signal having more than two cycles of the clock signal.

20. The apparatus of claim 19, wherein a first occurrence of the second command signal and a second occurrence of the second command signal are integrated such that a logic level of the second command signal is fixed over the first and second occurrences.

* * * * *